3,551,246

RADIATION CURABLE COMPOSITIONS

Robert W. Bassemir, Jamaica, N.Y., and Daniel J. Carlick, Berkeley Heights, and Gerhard E. Sprenger, Carlstadt, N.J., assignors to Sun Chemical Corporation, New York, N.Y., a corporation of Delaware No Drawing. Continuation-in-part of application Ser. No. 651,976, July 10, 1967. This application Nov. 24, 1967, Ser. No. 685,249
Int. Cl. B29c *19/02;* C08d *1/00;* C08b *1/11*
U.S. Cl. 156—272 32 Claims

ABSTRACT OF THE DISCLOSURE

Photopolymerizing compositions are considerably improved by incorporation therein of ethylenically unsaturated esters of pentaerythritol, dipentaerythritol, and polypentaerythritols with acrylic, methacrylic, or itaconic acids.

The present application is a continuation-in-part of copending application S.N. 651,976 (filed July 10, 1967). It relates to photopolymerizable compositions, elements, and processes of photopolymerization. More particularly, this invention relates to compositions containing certain photopolymerizable polyfunctional ethylenically unsaturated compounds exhibiting improved drying speeds.

In the past, it has been known to prepare compositions used as coating materials and the like which consisted essentially of photopolymerizable ethylenically unsaturated monomeric materials. It is also known that such monomeric materials when exposed to actinic energy are converted to polymers. Such monomeric materials when containing certain photoinitiators will polymerize at a vastly improved rate when exposed to suitable actinic energy.

In one embodiment of the present invention, the photopolymerizable compound may be modified by the inclusion of a compatible unsaturated material to improve the mechanical properties important for its use. In another embodiment, a compatible material which is coreactive with the compound in the presence of oxygen may be introduced into the composition. The coreactive material may be monomeric or polymeric in nature, may link up with the compound, and otherwise modify various properties thereof. In still another embodiment of the present invention, a chain transfer agent, e.g., a material capable of chain propagation, may be added to the compound. Mixtures of the above components are also within the teachings of the present invention and, where necessary, polymer stabilizers may be added.

The photopolymerizable compounds usable in the present invention are free radical polymerizable polyethylenically unsaturated monomers or prepolymers generally described as the acrylic acid esters, the methacrylic acid esters, and the itaconic acid esters of aliphatic polyhydric alcohols and specifically as the esters of pentaerythritol, dipentaerythritol, and polypentaerythritols, and so forth, with at least two mols of acrylic, methacrylic, or itaconic acid. Specific examples include, but are not limited to, pentaerythritol diacrylate, pentaerythritol triacrylate, dipentaerythritol triacrylate, pentaerythritol tetraacrylate, dipentaerythritol diacrylate, dipentaerythritol tetraacrylate, dipentaerythritol pentaacrylate, dipentaerythritol hexacrylate, tripentaerythritol octoacrylate, and the like; prepolymers of these esters, e.g., dimers, trimers, and other oligomers, and mixtures and copolymers thereof; as well as mixtures of the monomers and prepolymers. The photopolymerizable monomers of application S.N. 556,568, filed June 10, 1966, may be mixed with the photopolymerizable compounds of the present invention to desirable modification of the properties of shelf life and of drying. Trimethylolpropane triacrylate has been found to be particularly suitable as a modifying photopolymerizable monomer, producing improved adhesion of the product and only slightly affecting the curing rate of the composition. These modifying photopolymerizable monomers may be used in amounts of from 0 to about 65% by weight of the total composition.

The photopolymerizable compounds may be used in amounts ranging between about 15 and 90% by weight of the complete photopolymerizable composition, and preferably about 30% to 70% by weight.

The above-described esters may be obtained by any known and convenient means, for example, by the ester interchange method of interacting an ester of the acid and a suitably volatile alcohol with the polyhydric alcohol in the presence of a suitable catalyst or by the direct reaction of the polyhydric alcohol with, e.g., acrylic acid or an acrylyl halide.

The photoinitiators or sensitizers are used in amounts of from about 1 to 25% by weight, and preferably from about 2% to 15%, of the total photopolymerizable composition. Preferred photoinitiators include acyloins and derivatives thereof, such as, for example, benzoin methyl ether, benzoin ethyl ether, desyl bromide, desyl chloride, desyl amine, and the like, and mixtures thereof.

Factors varying the rate at which a photopolymerizable composition will dry include the specific ingredients in the composition, concentration of the photoinitiators, thickness of the material, nature and intensity of the radiation source and its distance from the material, the presence or absence of oxygen, and the ambient temperature. The compositions of the present invention may be used in relatively thick layers or may be used as thin films having thicknesses of from about 0.5 to 150 microns, and preferably from about 1 to 10 microns.

Any suitable source of radiation may be used, such as for example a 100-watt Hanovia high pressure mercury arc quartz ultraviolet lamp; larger ultraviolet sources of higher wattage; a linear electron accelerator; or gamma radiation emitters, such as cobalt-60. Distances of the lamp from the work may range from about ⅛ to 10 inches and preferably from about ⅛ to 3 inches.

In another embodiment of the present invention, the photopolymerizable ester is modified by the inclusion of a compatible substance which is coreactive with it in the presence of oxygen. A viscosity control agent, for example, may be introduced into the system with the ester and add plasticizing properties thereto. Some coreactive substances which may be added to the photopolymerizable monomer of prepolymer include unsaturated polyester resins, epoxy resins, aryl sulfonamide-formaldehyde resins, urea formaldehyde resins, and cetyl vinyl ether. These substances react with the monomer or prepolymer and improve various properties of the composition. The polyester resins, for example, improve the adhesive plasticizing and rheological properties of the composition. The epoxy resins, i.e., synthetic resins possessing terminal epoxide groups, e.g., a lower molecular weight prepolymer produced by condensation of epichlorhydrin with bisphenol A, produce excellent bonding and result in flexible films which are especially suitable for lamination purposes. The urea formaldehyde resins work particularly well in supplementary heat catalyst systems wherein the temperature of the surrounding atmosphere is raised to about 150° F. or higher. The cetyl vinyl ether lends plasticizing properties to the photopolymerizable composition. These resins and monomers may be utilized in amounts between about 10 and 50% of the total composition.

Prepolymers, such as diallyl phthalate prepolymers, may be added to the photopolymerizable compound to react therewith in the presence of oxygen. The prepolymers may be used in amounts of from about 10 to 50% by weight of the total composition and result in tough, more flexible surface-cured films.

The above-described photopolymerizable compound may also be improved by the inclusion of from about 0.1 to 2.0% by weight of a chain transfer agent. Suitable compounds include the mercaptans and their derivatives, e.g., glycol mercaptoacetate and ethyl mercaptoacetate; tertiary aliphatic amines, e.g., triethanolamine and t-butyldiethanolamine; morpholine; n-amino morpholine; n-amino ethylmorpholine; n-amino propylmorpholine; amine oxides, e.g., bis(2-hydroxyethyl)cocoamine oxide and bis(2-hydroxyethyl)octadecylamine oxide; cyclicized unsaturated aromatic hydrocarbons, e.g., neohexene, cyclohexane, cyclooctene, and d-limonene; and the like; and mixtures thereof. Typical cure times with the use of compositions including chain transfer agents have been less than one-half second when a film about 1 to 10 microns thick is exposed to actinic energy. Polymerization of compositions including chain transfer agents during storage of extended periods may be retarded by the inclusion of from about 0.1 to 5% of a stabilizer which is compatible with the photopolymerizable composition and does not significantly affect the polymerization rate thereof when exposed to ultraviolet light. Such a stabilizer is typified by diethylhydroxylamine.

The above-described additives may further be used in varying mixtures. As will be seen more particularly in the following examples, the photopolymerizable compounds of the present invention may be modified by the addition of a prepolymer and a chain transfer agent; a viscosity control agent and a chain transfer agent, a prepolymer, or other modifying resin; and mixtures thereof. In general, in the photopolymerizable compositions of the present invention, the photopolymerizable compound may be utilized in amounts of from about 15 to 98% by weight and the modifying compound or compounds in amounts of from about 2 to 85% by weight.

The photopolymerizable compositions of the present invention are suitable as adhesives, particularly in the laminating art; as coatings for metals, plastics, textiles, paper, and glass; as markers for roads, parking lots, airfields, and similar surfaces; as vehicles for printing inks, lacquers, and paints; and in the preparation of photopolymerizable elements, i.e., a support having disposed thereon a photopolymerizable layer of a composition as described herein. Moreover, various dyestuffs, pigments, plasticizers, lubricants, and other modifiers may be incorporated to obtain certain desired characteristics in the finished products.

When a photopolymerizable composition of the present invention is used as an adhesive, at least one of the lamina must be translucent when ultraviolet light is used. When the radiation source is an electron beam or gamma radiation, at least one of the lamina must be capable of transmitting high energy electrons or gamma radiation, respectively, and neither is necessarily translucent to light. Typical laminations include polymer-coated cellophane to polymer-coated cellophane films, treated polyethylene to treated polyethylene films, Mylar to a metal substrate such as copper, opaque oriented polypropylene to aluminum, polymer-coated cellophane to polypropylene, and the like. Particularly suitable compositions for use in lamination include mixtures of a photopolymerizable ester with an aryl sulfonamide-formaldehyde resin. The latter system gives a highly suitable, flexible plasticized film giving a tear seal for coated cellophane to coated cellophane and coated cellophane to treated polypropylene laminations and near tear seals for treated polyethylene to treated polyethylene laminations.

The photopolymerizable compositions of the present invention may be utilized for metal coatings and particularly for metals which are to be subsequently printed. Glass and plastics may also be coated, and the coatings are conventionally applied by roller or spray. Pigmented coating systems may be used for various polyester and vinyl films; polymer-coated cellophane; glass; treated and untreated polyethylene, for example in the form of disposable cups or bottles; and the like. Examples of metals which may be coated include sized and unsized tin plate.

When used as vehicles for inks, e.g., printing inks, the compositions of the present invention should include photopolymerizable compounds which have low evaporation rates. The compositions may be pigmented with many organic or inorganic pigments, e.g., molybdate orange, titanium white, chrome yellow, phthalocyanine blue, and carbon black, as well as colored with dyes. Stock which may be printed includes paper, clay-coated paper, and boxboard. In addition, the compositions of the present invention are suitable for the treatment of textiles, both natural and synthetic, e.g., in vehicles for textile printing inks or for specialized treatments of fabrics to produce water repellency, oil and stain resistance, crease resistance, etc.

Photopolymerizable elements of this invention comprise a support, e.g., a sheet or plate, having superimposed thereon a layer of the above-described photopolymerizable compositions. Suitable base or support materials include metals, e.g., steel and aluminum plates, sheets, and foils, and films or plates composed of various film-forming synthetic resins or high polymers, such as addition polymers, and in particular vinyl polymers, e.g., vinyl chloride polymers; vinylidene chloride polymers; vinylidene chloride copolymers with vinyl chloride, vinyl acetate, or acrylonitrile; and vinyl chloride copolymers with vinyl acetate or acrylonitrile; linear condensation polymers such as polyesters, e.g., polyethylene terephthalate; polyamides; etc. Fillers or reinforcing agents can be present in the synthetic resin or polymer bases. In addition, highly reflective bases may be treated to absorb ultraviolet light, or a light-absorptive layer can be transposed between the base and photopolymerizable layer.

Photopolymerizable elements can be made by exposing to ultraviolet light selected portions of the photopolymerizable layer thereof until addition polymerization is completed to the desired depth in the exposed portions. The unexposed portions of the layer are then removed, e.g., by use of solvents which dissolve the monomer or prepolymer but not the polymer.

The invention and its advantages will be better understood with reference to the following illustrative examples, but is not intended to be limited thereto. In the examples, the parts are given by weight unless otherwise specified. Unless otherwise indicated in the following examples, the ingredients were mixed until thoroughly blended. When a specific ingredient is solid at room temperature, the mixture may be heated to melt the solid ingredient, but generally not above 100° C. The atmospheric and temperature conditions were ambient unless otherwise noted; in Examples 1–20 the compositions were exposed at varying distances between ½ and 10 inches from a high pressure mercury arc quartz ultraviolet lamp, such as manufactured by Hanovia, in film thicknesses between 1 micron and 10 mils.

EXAMPLES 1–3

A comparison of the rates of drying while exposed to atmospheric oxygen was made of pentaerythritol triacrylate (PTETA), trimethylolpropane triacrylate (TMPTA), and mixtures of the two in the presence of benzoin methyl ether as photo-initiator. Each of the compositions set forth below was tested by exposing a thin film thereof on a glass slide at a distance of ten inches from a 1200-watt Hanovia lamp, and the times required to produce a tack-free film are shown below.

| | Composition in parts by weight | | | |
|---|---|---|---|---|
| | TMPTA | PTETA | Benzoin methyl ether | Drying time in seconds |
| Example No.: | | | | |
| 1 | 98.0 | | 2.0 | (1) |
| 2 | 49.0 | 49.0 | 2.0 | 15 |
| 3 | | 98.0 | 2.0 | 10 |

[1] More than 90.

The compositions of Examples 2 and 3 demonstrate the significantly increased drying rate of the photopolymerizable monomers containing pentaerythritol triacrylate (PTETA).

EXAMPLES 4–6

Photopolymerizable compositions of pentaerythritol triacrylate (PTETA) and benzoin methyl ether were tested to show the drying rate with a film modifier, Santolite MHP (a p-toluene sulfonamide formaldehyde resin sold by Monsanto Chemical Company), and also to determine what effect a chain transfer agent, triethanolamine (TEA), had on the drying rate. The compositions set forth below are in parts by weight and the drying time, in seconds, was determined in the same manner as that used in Examples 1–3.

| | Composition | | | | |
|---|---|---|---|---|---|
| | PTETA* | Benzoin methyl ether | Santolite MHP | TEA | Drying time in seconds |
| Example No.: | | | | | |
| 4 | 48.5 | 2.0 | 48.5 | 1 | About 2. |
| 5 | 48.0 | 2.0 | 48.0 | 2 | Less than 1. |
| 6 | 49.0 | 2.0 | 49.0 | | About 5. |

*Containing dimethyl hydroquinone inhibitor.

The inclusion of 1 to 2% of triethanolamine resulted in doubling the speed of drying without affecting the stability of the compositions.

EXAMPLE 7

A photopolymerizable composition of dipentaerythritol hexacrylate (DPEHA), a photoinitiator, and Santolite MHP was prepared and tested, using the exposure method of Examples 1–3.

Composition (Example No. 7)

| | |
|---|---|
| DPEHA | 49.0 |
| Benzoin methyl ether | 2.0 |
| Santolite MHP | 49.0 |
| Drying time in seconds | 2.5 |

EXAMPLE 8

A photopolymerizable composition was prepared by mixing tripentaerythritol octacrylate (TPEOA) with a photoinitiator and Santolite MHP. Drying time was determined by the method of Examples 1–3.

Composition (Example No. 8)

| | |
|---|---|
| DPEHA | 49.0 |
| Benzoin methyl ether | 2.0 |
| Santolite MHP | 49.0 |
| Drying time in seconds | 1.0 |

EXAMPLES 9–15

Tests were conducted to determine the effect of other monomers on tripentaerythritol octoacrylate. These compositions are in parts by weight as indicated below with the monomers being tripentaerythritol octoacrylate (TPEOA), trimethylolpropane triacrylate (TMPTA), and pentaerythritol triacrylate (PTETA); a photoinitiator; and a modifier.

| | Composition | | | | | |
|---|---|---|---|---|---|---|
| | TPEOA | TMPTA | PTETA | Benzoin methyl ether | Santolite MHP | Drying time in seconds |
| Example No.: | | | | | | |
| 9 | 80 | | | 2.0 | 18 | 1.0 |
| 10 | 75 | 5 | | 2.0 | 18 | 1.0 |
| 11 | 70 | 10 | | 2.0 | 18 | 1.0 |
| 12 | 45 | 35 | | 2.0 | 18 | 1.5 |
| 13 | 75 | | 5 | 2.0 | 18 | 1.5 |
| 14 | 70 | | 10 | 2.0 | 18 | 1.0 |
| 15 | 45 | | 35 | 2.0 | 18 | 4.0 |

The inclusion of from 5 to 10% of either trimethylolpropane triacrylate or pentaerythritol triacrylate did not substantially affect the drying time of the tripentaerythritol octoacrylate but did reduce the viscosity of the monomer, thereby making the composition more suitable as an ink vehicle-binder.

EXAMPLE 16

The procedure of Example 3 was repeated using pentaerythritol tetraacrylate instead of pentaerythritol triacrylate. The drying time was 7 seconds.

EXAMPLE 17

(A) A mixture of dimers and trimers, i.e., a prepolymer, of pentaerythritol triacrylate was prepared as follows: the benzene of a solution of 95 parts of pentaerythritol triacrylate in 5 parts of benzene was distilled off at 60–70° C. under a reduced pressure of 30 mm. Hg absolute or less. During the course of the distillation the contents of the distillation apparatus congealed to a more or less stiff gel, depending upon the duration of the distilling procedure.

The gel was a mixture of low polymers of pentaerythritol triacrylate. It was separable into fractions of varying degrees of polymerization by consecutive extraction with appropriate solvents; for example, a benzene extract contained only the monomer, dimer, and some trimer which could be separated from each other by fractional precipitation with hexane. Fluorinated hydrocarbons could be used to dissolve higher polymers which could thus be obtained from that portion of the polymer which was insoluble in benzene.

(B) A composition of 45% of a prepolymer mixture of part (A), 35% of trimethylolpropane triacrylate, 2% of benzoin methyl ether, and 18% of Santolite MHP dried in 1.5 seconds.

EXAMPLE 18

A composition of 59% of a prepolymer mixture of Example 17(A), 49% of Santolite MHP, and 2% of benzoin methyl ether dried in 5 seconds.

EXAMPLE 19

A composition of 49% of a prepolymer mixture of dipentaerythritol hexacrylate, 5% of trimethylolpropane triacrylate, 2% of benzoin methyl ether, and 18% of Santolite MHP dried in 1 second.

EXAMPLE 20

A composition of 49% of a prepolymer mixture of dipentaerythritol hexacrylate, 49% of Santolite MHP, and 2% of benzoin ethyl ether dried in 2.5 seconds.

EXAMPLES 21–40

The procedure of Examples 1 through 20 were repeated except that instead of being exposed to ultraviolet light the samples were passed on a conveyor belt beneath the beam of a 300,000-volt linear electron accelerator at a speed and beam current so regulated as to produce a dose rate of 0.5 megarad.

These systems produced resinous materials of varying degrees of hardness in films from 0.5 to 20 mils thick having a tacky surface.

EXAMPLE 41

A thin film of a composition containing 49% of a prepolymer mixture of dipentaerythritol hexacrylate, 49% of Santolite MHP, and 2% of benzoin ethyl ether was applied to a sheet of aluminum plate and then exposed to a 1200-watt ultraviolet source at a fixed distance. The film was dried in about 2.5 seconds.

EXAMPLE 42

The procedure of Example 41 was repeated except that the substrate was cardboard. The film was dried in about 2.5 seconds.

EXAMPLE 43

Lithol rubine red pigment (15%) was ground into the composition of Example 17(B) to give a printing ink. It was exposed to ultraviolet light as in Example 41. The drying time was 1 second.

EXAMPLE 44

A laminate was made of a film of polymer-coated cellophane and a film of oriented polypropylene with the composition of Example 17(B) between the two. The laminate was exposed to ultraviolet light as in Examples 1–3, and a tight bond was effected in 1 second.

EXAMPLE 45

A laminate was made of a sheet of copper and a film of Mylar with the composition of Example 17(B) between the two. The laminate was exposed to electron beam radiation as in Examples 21–40. A tight seal was effected.

EXAMPLE 46

The procedure of Example 41 was repeated except that the substrate was glass. The film was dried in about 2.5 seconds.

What is claimed is:

1. A radiation-curable composition consisting essentially of (1) about 15 to 90 percent by weight of at least one ester of an ethylenically unsaturated acid and pentaerythritol, dipentaerythritol, or a polypentaerythritol; (2) about 10 to 85 percent by weight of an aryl sulfonamide-formaldehyde resin; and (3) about 1 to 25 percent by weight of a photoinitiator selected from the group consisting of acyloin and acyloin derivatives.

2. A radiation-curable composition consisting essentially of (1) about 15 to 90 percent by weight of at least one ester of an ethylenically unsaturated acid and pentaerythritol, dipentaerythritol, or a polypentaerythritol; (2) about 10 to 85 percent by weight of cetyl vinyl ether; and (3) about 1 to 25 percent by weight of a photoinitiator selected from the group consisting of acyloin and acyloin derivatives.

3. The composition of claim 1 wherein the ester is an acrylate, a methacrylate, or an itaconate.

4. The composition of claim 1 wherein the ester is pentaerythritol triacrylate.

5. The composition of claim 1 wherein the ethylenically unsaturated ester is a monomer.

6. The composition of claim 1 wherein the ethylenically unsaturated ester is a prepolymer.

7. The composition of claim 1 wherein the photoinitiator is benzoin methyl ether.

8. The composition of claim 1 wherein the photoinitiator is benzoin ethyl ether.

9. The composition of claim 2 wherein the ester is an acrylate, a methacrylate, or an itaconate.

10. The composition of claim 1 wherein from 30 to 70% of the composition of dipentaerythritol hexacrylate.

11. The composition of claim 1 wherein from 30 to 70% of the composition is depentaerythritol hexacrylate.

12. The composition of claim 1 wherein from 30 to 70% of the composition is tripentaerythritol octoacrylate.

13. The composition of claim 1 wherein the ethylenically unsaturated ester is a mixture of the dimers and trimers of pentaerythritol triacrylate.

14. A method of drying which comprises exposing the composition of claim 1 to radiation.

15. A method of drying which comprises exposing the composition of claim 1 to ultraviolet light.

16. A method of drying which comprises exposing the composition of claim 1 to electron beam radiation.

17. An article having a dried coating of the composition of claim 1.

18. A photopolymermizable ink comprising (1) the composition of claim 1 as the binder and (2) a coloring agent selected from the group consisting of dyes and pigments.

19. A method of laminating which comprises joining two members with an intermediate layer comprising the composition of claim 1 and exposing said intermediate layer to a source of radiation whereby said intermediate layer is dried and adhesively joins said members.

20. A method of laminating which comprises joining two members with an intermediate layer comprising the composition of claim 1, at least one of said members being capable of transmitting ultraviolet light, and exposing said intermediate layer to ultraviolet light, thereby drying said intermediate layer and adhesively joining said members.

21. An article comprising two films adhered by the method of claim 19.

22. A method of laminating which comprises joining two members with an intermediate layer comprising the composition of claim 1, at least one of said members being capable of transmitting high energy electrons, and exposing said intermediate layer to electron beam radiation, thereby drying said intermediate layer and adhesively joining said members.

23. An adhesive comprising the composition of claim 1.

24. A coating composition comprising the composition of claim 1.

25. A photopolymerizable element comprising a support and a coating thereon of the photopolymerizable composition of claim 1.

26. A radiation-curable ink comprising (1) the composition of claim 2 as the binder and (2) a colorant.

27. An adhesive comprising the composition of claim 2.

28. A coating composition comprising the composition of claim 2.

29. An article having a dried coating of the composition of claim 2.

30. A radiation-curable element comprising a support and a coating thereon of the radiation-curable composition of claim 2.

31. A method of drying which comprises exposing the composition of claim 2 to radiation.

32. A method of laminating which comprises joining two members with an intermediate layer comprising the composition of claim 2 and exposing the intermediate layer to a source of radiation whereby the intermediate layer is dried and adhesively joins the members.

References Cited

UNITED STATES PATENTS

| | | | |
|---|---|---|---|
| 3,203,802 | 8/1965 | Burg | 204—159.23 |
| 3,368,900 | 2/1968 | Burg | 204—159.23 |

SAMUEL H. BLECH, Primary Examiner

R. B. TURER, Assistant Examiner

U.S. Cl. X.R.

117—124, 132, 138.8, 155, 161; 161—218, 249, 254; 204—159.15, 159.23; 260—41, 78.5, 86.1, 836, 837, 851, 873